United States Patent [19]
DeMarco et al.

[11] Patent Number: 5,589,303
[45] Date of Patent: Dec. 31, 1996

[54] SELF-ALIGNED OPAQUE REGIONS FOR ATTENUATING PHASE-SHIFTING MASKS

[75] Inventors: John J. DeMarco, East Brunswick, N.J.; Taeho Kook, Lower Macungie Township, Lehigh County, Pa.; Robert L. Kostelak, Jr., Bernardsville, N.J.

[73] Assignee: Lucent Technologies Inc., Murray Hill, N.J.

[21] Appl. No.: 366,952

[22] Filed: Dec. 30, 1994

[51] Int. Cl.⁶ .................................................. G03F 9/00
[52] U.S. Cl. ............... 430/5; 430/322; 430/323; 216/48; 216/47
[58] Field of Search ............... 430/5, 322, 323; 156/652

[56] References Cited

U.S. PATENT DOCUMENTS 5,362,591  10/1990  Imai et al. ................................. 430/5
5,405,721  12/1993  Pierrat ...................................... 430/5

*Primary Examiner*—S. Rosasco

[57] ABSTRACT

An attenuating phase-shifting optical lithographic mask is fabricated, in a specific embodiment of the invention, by first depositing a uniformly thick molybdenum silicide layer on a top planar surface of quartz. The molybdenum silicide layer has a thickness sufficient for acting as an attenuating (partially transparent) layer in a phase-shifting mask. A uniformly thick chromium layer is deposited on the molybdenum silicide layer. The chromium layer has a thickness sufficient for acting as an opaque layer in the phase-shifting mask. Next, the chromium layer is patterned by dry or wet etching, while the chromium is selectively masked with a patterned resist layer. Then the molybdenum silicide is patterned by dry or wet etching, using the patterned chromium layer as a protective layer, whereby a composite layer of molybdenum silicide and chromium is formed having mutually separated composite stripes. Any remaining resist is removed. Next the top and sidewall surfaces of some, but not others, of these mutually separated stripes are coated with a second patterned resist layer. Finally, the chromium layer, but not the molybdenum silicide layer, is removed from the others of the mutually separated composite stripes.

18 Claims, 2 Drawing Sheets

SELF-ALIGNED OPAQUE REGIONS FOR ATTENUATING PHASE-SHIFTING MASKS

TECHNICAL FIELD

This invention relates to optical lithography, such as that used for fabricating semiconductor integrated circuits and other devices. More particularly, the invention relates to optical lithographic masks and to methods of making such masks, for use in optical lithographic systems for fabricating such circuits and devices. These masks are also called "reticles" particularly when they are used in optical systems having magnifications different from unity.

BACKGROUND OF THE INVENTION

FIG. 1 shows an optical lithographic fabrication system 100 for defining features in a workpiece 120, in accordance with prior art. Typically the workpiece 120 comprises a semiconductor wafer (substrate), together with one or more layers of substances (not shown) located on a top major surface of the wafer.

More specifically, typically substantially monochromatic optical radiation of wavelength $\lambda$ is emitted by an optical source 106, such as a mercury lamp. This radiation propagates successively through an aperture in an opaque screen 105, an optical collimating lens or lens system 104, a patterned lithographic mask ("reticle") 103 having a pattern of features in the form of apertures (bright regions) in an opaque material, and an optical focusing lens or lens system 102. The optical radiation emanating from the reticle 103 is focused by the lens 102 onto a photoresist layer 101 located on the top major surface of the workpiece 120. Thus the pattern of the reticle 103—that is, its pattern of transparent and opaque portions—is focused on the photoresist layer 101. Depending upon whether this photoresist is positive or negative, when it is subjected to a development process (typically a wet development process), the material of the photoresist is removed or remains intact, respectively, at and only at areas where the optical radiation was incident. Thus, the pattern of the mask is transferred to ("printed on") the photoresist layer 101.

Subsequent etching processes, such as wet etching or dry plasma etching, remove selected portions of the workpiece 120 typically comprising a semiconductor wafer. That is to say, portions of the workpiece 120 are removed from the top surface of the workpiece 120 at areas underlying those where the photoresist layer 101 was removed by the development process but not at areas underlying those where the photoresist remains intact. Alternatively, instead of thus selectively etching the workpiece 120, impurity ions can be implanted into the workpiece 120 at areas underlying those where the photoresist layer was removed by the development process but not at areas underlying those where the photoresist remains. Thus, in any event, the pattern of the mask 103—i.e., each feature of the mask—is transferred to the workpiece 120 as is desired, for example, in the art of semiconductor integrated circuit fabrication.

As known in the art, the aperture in the opaque screen 105 is located on the focal plane of the collimating lens 104, and the indicated distances L1 and L2 satisfy in cases of a simple lens 102: $1/L1+1/L2=1/F$, where F is the focal length of the lens 102.

In fabricating integrated circuits, it is desirable, for example, to have as many transistors per wafer as possible. Hence, it is desirable to make transistor sizes as small as possible. Similarly it is desirable to make as small as possible any other feature size, such as the feature size of a metallization stripe—i.e., its width—or of an aperture in an insulating layer that is to be filled with metal, for example, in order to form electrical connections between one level of metallization and another.

According to geometric optics, if it is desired to print on the photoresist layer 101 the corresponding feature having a width equal to W, a feature having a width equal to C is located on the mask (reticle) 103. Further, according to geometric optics, if this feature of width equal to C is a simple aperture in an opaque layer, then the "lateral magnification" $m=W/C$, where $m=L2/L1$. When diffraction effects become important, however, instead of a sharp black-white image, a diffraction pattern of the object feature C is formed on the photoresist layer 101, whereby the edges of the image become indistinct. Consequently, the resolution of the features of the reticle 103, as focused on the photoresist layer and transferred to the workpiece, deteriorates.

In prior art this diffraction problem has been alleviated by such techniques as using a mask having phase-shifting regions containing a pattern of phase-shifting features. The mask is then known as a "phase-shifting mask"—and hereinafter the mask 103 will therefore likewise be called "the phase-shifting mask 103." These phase-shifting features impart a phase shift $\phi$ to the optical beam of wavelength $\lambda$ propagating through the mask 103 relative to other features on the mask located on selected areas of the mask. Typically this phase shift $\phi$ is made equal to approximately $\pi(=180°)$. The pattern of these phase-shifting features is typically located in a so-called "primary feature region" of the mask.

Phase-shifting masks can be fabricated with their phase-shifting features formed by "clear" areas and "attenuating" areas. A "clear area" is a transparent area—i.e., an area having an optical intensity transmission coefficient T=1, approximately, at the wavelength $\lambda$. An "attenuating area" is a partially transparent area—i.e., an area in which T (at the wavelength $\lambda$) advantageously is in the approximate range of 0.05 to 0.15, typically approximately 0.10. The phase shift $\phi$ is then the phase shift of the radiation of wavelength $\lambda$ propagating through the clear areas relative to the attenuating areas. Such a mask is known as an "attenuating phase-shifting mask." In addition, if desired, the primary feature region of such a mask can include opaque areas—that is, areas for which T<0.01, approximately, at the wavelength $\lambda$.

Thus, in an attenuating phase-shifting mask, features such as that shown in the form of a simple aperture C in the mask 103 will become more complicated than just simple apertures and will include the pattern of the above-mentioned phase-shifting features (not shown in FIG. 1). More specifically, the primary feature region contains the abovementioned pattern of phase-shifting features whereby the images formed by them on the photoresist layer 101 correspond to device features of the workpiece 120 (such as selected areas of the workpiece 120 where impurity ions are implanted or selected areas of the workpiece 120 where portions of the workpiece 120 are removed).

As known in the art, a step-and repeat tool (not shown) is used in conjunction with a step-and repeat movement and exposure procedure for forming successive images on the photoresist layer 101. For this procedure, the workpiece 120 is subdivided into chip ("die") regions. Each such chip region typically is defined and encompassed by one resulting step-and-repeat position of the workpiece 120 (overlain by the photoresist layer 101). Each corresponding (i.e., overlying) chip region of the photoresist layer 101 is exposed in succession to the optical beam in the system 100. This exposure can be of the kind that exposes an entire chip region all at once to the incident optical beam (which has a sufficient cross section to encompass an entire chip region) or that scans the chip region with the incident optical beam (which does not have a sufficient cross section to encompass an entire chip region).

In order to align the mask 103 to the step-and-repeat tool (hereinafter, "stepper tool") for the step-and-repeat procedure, mask-to-stepper tool alignment marks (hereinafter "reticle alignment marks") are located on the mask 103 outside the primary feature region. Advantageously these reticle alignment marks (not shown in FIG. 1) comprise opaque areas. It is essential that these reticle alignment marks have edges that are self-aligned with respect to the edges of the primary feature region's attenuating areas. That is to say, it is essential that these reticle alignment marks and the attenuating areas of the primary feature region are formed during the same lithographic processing steps in which a single patterned resist layer defines both the edges of the reticle alignment marks and the edges of the attenuating areas of the primary feature region.

As further known in the art, in order to limit the optical radiation incident on the photoresist layer 101 to one chip region at a time, the stepper tool contains an opaquing shutter (hereinafter, "shutter blade"). In order to compensate for unavoidable positioning errors associated with locating this shutter blade, an opaque ring (not shown) is located on the mask itself. This opaque ring encircles the primary feature region. Advantageously, this opaque ring has an inside edge that is self-aligned with respect to, and borders the primary feature region.

In order to minimize the distance between chip regions (as defined by the step-and-repeat procedure), and hence to avoid wasting precious primary feature area on the workpiece 120, the inside edge of the opaque ring is self-aligned with respect to the features of the primary feature region. However, in the case of an attenuating phase-shifting mask, if (in the interest of economy) this ring is fabricated simultaneously with, and is fabricated with the same attenuating materials as those of, the attenuating areas (of the primary feature region), then this ring will thus transmit approximately 10 percent of the incident light intensity, instead of zero. Consequently, during the step-and-repeat exposure procedures, edge regions of the primary feature region will receive as much as approximately 20 percent (=2×10 percent) of the incident light intensity because of their having been exposed to the incident light during as many as two different step-and-repeat exposures. Corner regions will receive as much as approximately 40 percent (=4×10 percent) of the incident light intensity because of their having been exposed to the incident light on as many as four different step-and-repeat exposures. An unwanted optical background thus arises in the edge and corner regions of the primary feature regions. This background will cause deterioration of the definition of the features located in these edge and corner regions.

In addition to this background problem, the sharpness of definition (contrast ratio) of the images of the abovementioned reticle alignment marks are reduced when these alignment marks are formed (in the interest of economy) by attenuating areas simultaneously with the attenuating areas of the primary feature region, rather than by opaque areas. This reduction in contrast ratio can cause a deterioration of the accuracy of the alignment of the mask 103 relative to the stepper tool and hence ultimately to the workpiece 120.

Moreover, as mentioned above a phase-shifting feature in an attenuating phase-shifting mask is defined by two basic kinds of areas: (1) attenuating areas, and (2) clear areas. It would therefore be desirable to have a method of fabricating these two kinds of basic areas, together with opaque areas for the reticle alignment marks or for the opaque ring, or for both the reticle alignment marks and the opaque ring, in a self-aligned manner. That is to say, it would be desirable that the method can define the phase-shifting region, including the edges of its attenuating areas, during the same lithographic steps as the method defines the edges of the opaque ring or of the reticle alignment marks, or as the method defines the edges of both the opaque ring and the reticle alignment marks. In addition, if the primary feature region contains opaque areas, it would be desirable that the method can form these opaque areas during the same ltithographic steps as, and (if desired) in a self-aligned manner with respect to, the primary feature region's attenuating areas.

SUMMARY OF INVENTION

In order to achieve one or more of the foregoing desired ends, an optical lithographic mask, which can be used as the mask 103 in the system 100, is fabricated according to the following steps:

(a) providing a transparent substrate having a top major planar surface upon which is located a first layer made of a first material, the first layer advantageously having a substantially uniform first thickness h, and the first material being partially transparent to optical radiation of wavelength $\lambda$;

(b) depositing a second layer made of a second material everywhere on the top surface of the first layer, the second layer being made of a second material that is chemically different from the first material, the second layer having a substantially uniform thickness, and the second layer being sufficiently thick so as to be, in combination with the first layer, opaque to the radiation of wavelength $\lambda$;

(c) forming a first patterned resist layer on the top surface of the second layer;

(d) etching lateral portions of the first and second layers, using the first patterned resist layer as a protective layer against the etching of the second layer, and using the first patterned resist layer or a resulting patterned second layer as a protective mask against etching the first material, whereby a first patterned opaque layer is formed having spaced-apart areas each of which has at least one edge (hereinafter "sidewall") and each of which is composed of a resulting patterned layer of the second material overlying a resulting similarly patterned layer of the first material;

(e) forming a second patterned resist layer that coats the entire top surfaces of, and the entire spaces between, at least some, but not all, of the spaced-apart areas;

(f) etching only the layer of the second material, but not any of the first material, using the second patterned resist layer as a protective mask against etching the second material, whereby a patterned opaque layer and a patterned partially transparent layer are formed.

During step (e), the patterned second resist layer either coats only a portion of a top surface of at least one (but not all) of the spaced-apart areas or coats the sidewall of at least one (but not all) of the spaced-apart areas.

The second patterned opaque layer is thereby formed in a region where the second patterned resist layer was present. The second patterned opaque layer—i.e., the (transparent) spaces between the spaced-apart areas or the (opaque) areas themselves located in this region where the second pattered resist layer was present—serves as the region containing the alignment marks, as well as the shutter marks (if any). The patterned partially transparent layer is formed in a region where the second patterned resist layer was not present and serves as the region containing the phase-shifting features.

Because during step (e) the second patterned resist layer coats the entire top surfaces of, and the entire spaces between, at least some, but not all, of the spaced-apart areas—therefore, the resulting second patterned opaque layer will be self-aligned with respect to the patterned partially transparent layer. That is to say, the alignment of the second patterned resist layer need not be precise so long as it coats the entire surfaces of, and the entire spaces between, the spaced-apart areas that are to be opaque and does not coat the region where the patterned partially transparent layer (phase-shifting region) is formed.

Advantageously any remaining thickness of the second patterned resist layer is stripped before using the resulting lithographic mask in the system 100.

Also, advantageously step (c) is performed by forming a first resist layer of substantially uniform thickness on the top surface of the second layer; followed by exposing the first resist to a first pattern of actinic radiation; and followed by developing the first resist layer.

Advantageously also, step (d) is performed by etching substantially only the second layer using the first patterned resist layer as a first protective mask, followed by (1) removing the first patterned resist layer, and (2) etching only the first layer using the resulting patterned second layer as a second protective mask.

DETAILED DESCRIPTION

Figure 1:
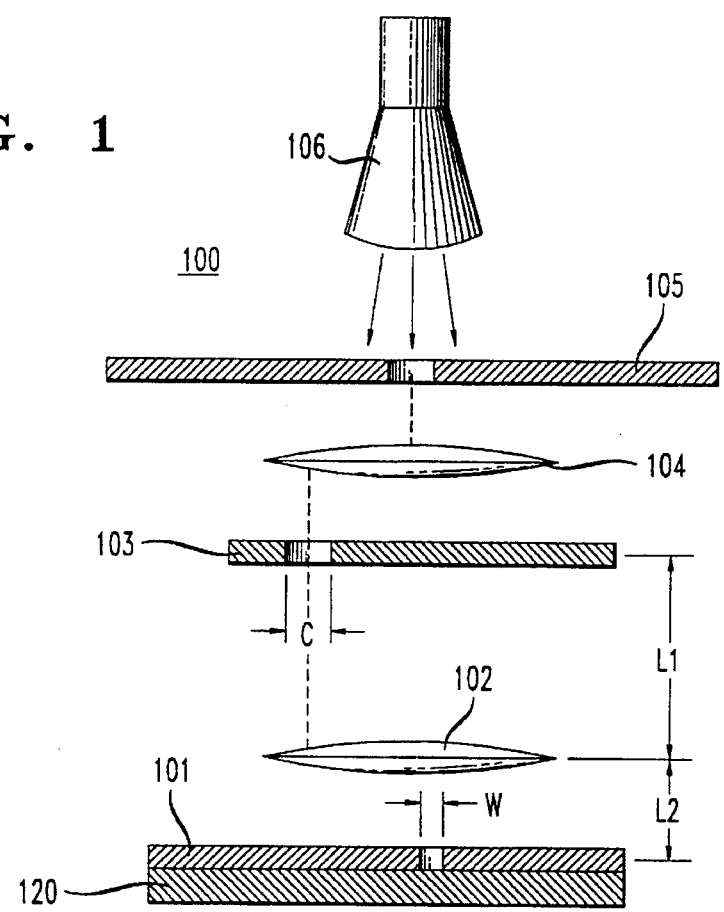
FIG. 1 depicts an optical lithographic system useful in the practice of this invention.
Figure 2:
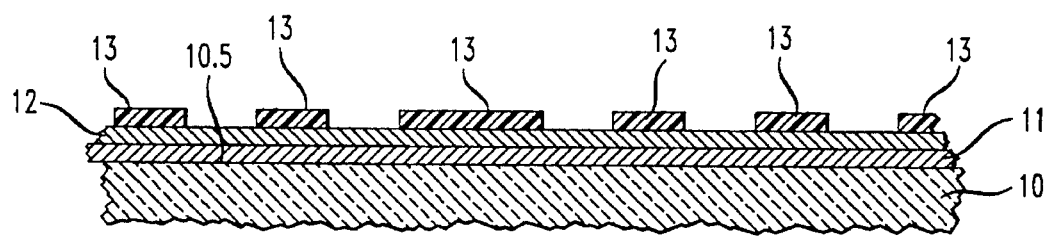
FIGS. 2–6 depict cross-sectional elevation views of various successive stages of a phase-shifting mask being fabricated, in accordance with a specific embodiment of the invention.

As shown in FIG. 2, a transparent parallel slab 10, typically of quartz, has a top major surface 10.5 upon which is located a partially transparent layer 11. This partially transparent layer 11 is typically made of molybdenum silicide and has a thickness typically in the approximate range of 80 nm to 100 nm. Upon the top surface of this partially transparent layer 11 is located an opaque layer 12, typically of chromium or chromium oxynitride. This opaque layer 12 need not be opaque by itself, but should have a thickness that is sufficient to render the combination of this opaque layer 12 and the partially transparent layer 11 opaque with respect to light of the wavelength $\lambda$.

A patterned resist layer 13 is located on the top surface of the opaque layer 12. The patterned resist layer 13 typically is formed by patterning a uniformly thick resist layer by means of exposing the resist to a pattern of actinic radiation, such as a pattern of light or of an electron beam, followed by developing the resist.

Figure 3:
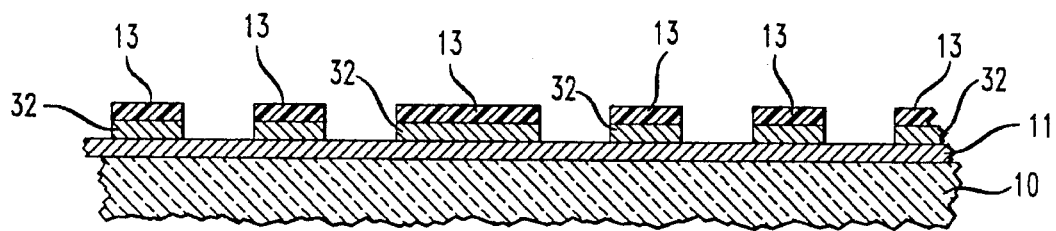
Figure 4:
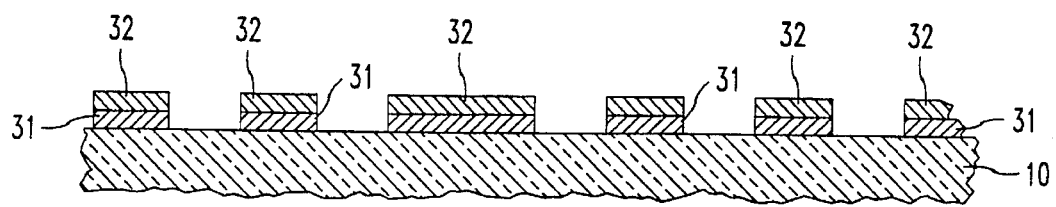

The top surface of the structure shown in FIG. 2 is subjected to a known dry or wet etching, whereby the entire thickness of the opaque layer 12 is removed at in all regions not protected by the patterned resist layer 13. In this way, the opaque layer 12 becomes a patterned opaque layer 32 (FIG. 3) Next the thus exposed portions of the partially transparent layer 11 are subjected to a known dry or wet etching, whereby the entire thicknesses of the exposed regions of the partially transparent layer 11 are removed, whereby (FIG. 4) a patterned partially opaque layer 31 is formed. This patterned partially opaque layer 31 together with the (overlying) patterned opaque layer 32 form spaced-apart areas each of which is formed by a pair of composite layers 31, 32. As viewed from above (not shown), these spaced-apart composite layers 31, 32 typically can take the forms of mutually separated (elongated) stripes, mutually separated islands, or a combination of both.

Any remaining portions of the resist layer 13 are then removed ("stripped"). Alternatively any portions of the patterned resist layer 13 that remain subsequent to the etching of the opaque layer 12 but prior to the etching of the partially transparent layer 11 are removed prior to the etching of the partially transparent layer 11. In such a case, the patterned opaque layer 32 serves as a protective patterned mask against the etching of the partially transparent layer 11.

Next (FIG. 5) the top surface of the structure being fabricated is coated with a second patterned resist layer 15. It can be patterned in much the same manner as was the resist layer 13 (FIG. 2). This second patterned resist layer 15 coats the entire top surfaces of, and the entire spaces between, some, but not all, of the composite layers 31, 32. It also coats only a portion of the top surface of one of the composite layers 31, 32. Then the structure being fabricated is subjected to a known wet or dry etch that removes the entire thickness of, and only of, the exposed portions of the patterned opaque layer 32 but does not remove any significant amount of the thickness of the patterned partially transparent layer 31. In this way (FIG. 6) a patterned composite layer 31, 32 and 31,62 remains only in those locations where the second patterned resist layer 15 was present. In the other locations, where the patterned resist layer 15 was not present, the only remaining layer (if any, apart from the transparent slab 10) is the patterned partially transparent layer 31.

Figure 5:
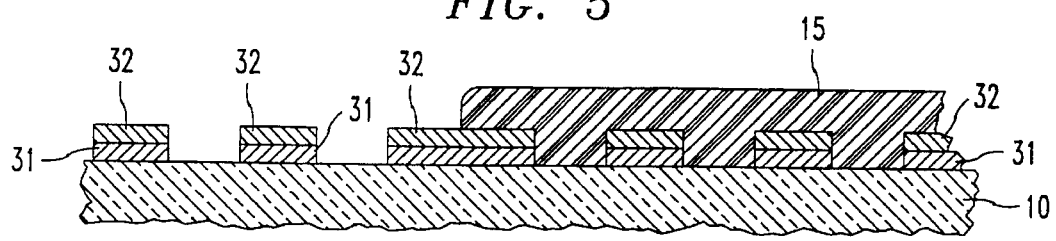
Figure 6:
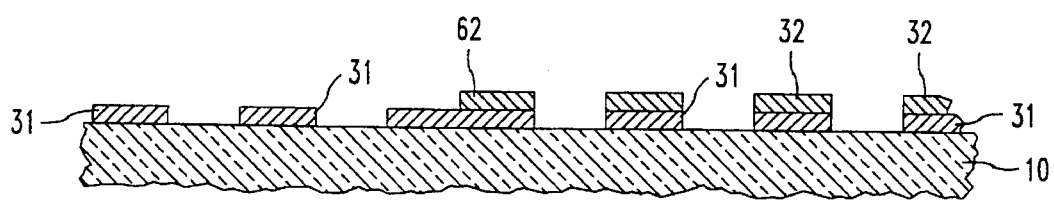
Figure 7:
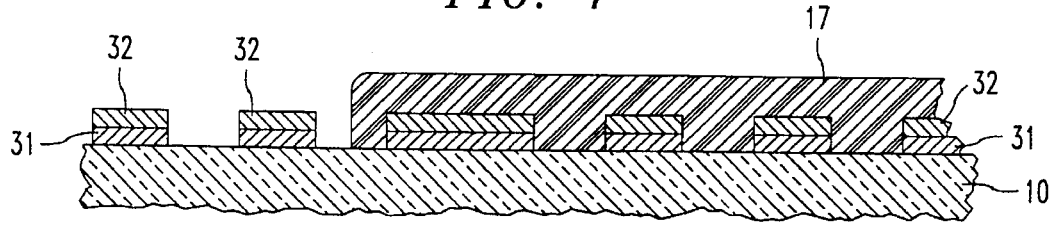
FIGS. 7–8 depict cross-sectional elevation views of two successive stages of the fabrication of a phase-shifting mask, in accordance with another specific embodiment of the invention.

Finally, any remaining resist material of the patterned resist layer 15 is removed. The resulting structure (FIG. 6) is particularly useful in case the phase-shifting feature of the mask formed by the noncomposite layers 31 terminates at its right-hand edge in a partially transparent (T=0.1) layer. In case this feature terminates at its right-hand edge in a transparent layer, the successive fabrication stages represented by FIGS. 5 and 6 are replaced by those represented in FIGS. 7 and 8, respectively. More specifically, the second resist layer 15 (FIG. 5) is replaced by a second resist layer 17 (FIG. 7). This latter resist layer 17 differs from the resist layer 15 in that the resist layer 17 coats only a portion of the space between a pair of adjacent patterned composite layers 31, 32. The exposed portions, and only the exposed portions, of the patterned opaque layer 32 (but not any significant thickness of the patterned partially transparent layer 31) are wet etched or dry etched. Finally, the patterned resist layer 17 is completely removed (FIG. 8).

Figure 8:
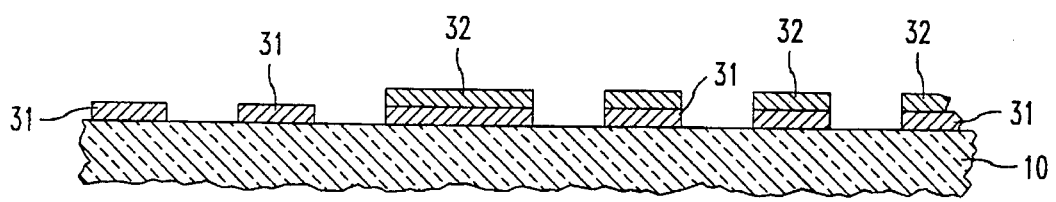

In the structures depicted in FIGS. 6 and 8, the patterned noncomposite attenuating areas 31, together with the spaces between them, form the primary feature region. In the structure depicted in FIG. 6, the patterned composite area 31, 62 can serve as the opaque ring. In the structure depicted in FIG. 8, the composite area 31, 32 located closest to the patterned noncomposite areas 31 can serve as the opaque ring. In both FIGS. 6 and 8, the remaining composite areas 31, 32 can serve as the reticle alignment marks.

In the structures depicted in both FIGS. 6 and 8, all the sidewalls of all the areas 31 and 32 were defined by the same patterned resist layer 13 and hence are self-aligned with respect to one another. Although the left-hand sidewall of the area 62 (FIG. 6 only) was not defined by the patterned resist layer 13; nevertheless, the right-hand edge of this area 62 indeed was defined by the patterned resist layer 13 and is therefore self-aligned with respect to the areas 31 and 32, and the entire area 62 was fabricated by the same processing steps as were the areas 32. Moreover, both the left-hand and the right-hand sidewalls of that attenuating area 31 which underlies the area 62 are self-aligned with respect to all the other attenuating areas 31.

Although the invention has been described in detail in terms of a specific embodiment, various modifications can be made without departing from the scope of the invention. For example, if desired, one or more opaque areas can be fabricated in the phase-shifting region, each of such areas having one or more of its sidewalls being self-aligned in similar manner, respectively, as the patterned opaque area 62 (FIG. 6) or the patterned opaque areas 32 (FIG. 6 or FIG. 8).

We claim:

1. A method of making an optical lithographic mask comprising the steps of:

(a) providing a substrate having a top surface upon which is located a first layer, the first layer being partially transparent to optical radiation of a wavelength $\lambda$;

(b) depositing a second layer chemically different from the first layer on the top surface of the first layer, the second layer being sufficiently thick so as to be, in combination with the first layer, opaque to the optical radiation of the wavelength $\lambda$;

(c) forming a first patterned resist layer on the top surface of the second layer;

(d) etching the first and second layers, using the first patterned resist layer as a protective layer against etching of the second layer and using the first patterned resist layer or the resulting patterned second material layer as a protective mask against etching the first layer, whereby a first patterned opaque layer is formed having spaced-apart areas each having a top surface bounded by at least one sidewall;

(e) forming a second patterned resist layer that coats the entire top surfaces of, and the entire spaces between, at least some, but not all, of the spaced-apart areas; and (f) etching only the patterned second layer using the second patterned resist layer as a protective mask against etching the patterned second layer, while using exposed portions of the first patterned opaque layer as a protective mask against etching the patterned first layer, whereby a second patterned opaque layer and a patterned partially transparent layer are formed, the second patterned opaque layer having a first pattern that includes at least an alignment indicator that is self-aligned with a second pattern of the partially transparent layer.

2. The method of claim 1 in which during step (e) the second patterned resist layer coats only a portion of the top surface of at least one, but not all, of the spaced-apart areas.

3. A photolithographic method including the steps of:

(a) forming the mask in accordance with the steps of claim 2;

(b) directing optical radiation of the wavelength $\lambda$ onto the mask, and focusing resulting optical radiation propagating through the mask onto a second photoresist layer located on a major surface of a wafer or onto a layer of substance located on the major surface of the wafer;

(c) developing the second photoresist layer, whereby an edge feature is formed therein; and (d) forming a feature at the major surface of the wafer or in the layer of substance, respectively, in accordance with the edge feature in the second photoresist layer.

4. The method of claim 1 in which during step (e) the second patterned resist layer coats only a portion of the space between at least one pair of the spaced-apart areas.

5. A photolithographic method including the steps of:

(a) forming the mask in accordance with the steps of claim 4;

(b) directing optical radiation of the wavelength $\lambda$ onto the mask, and focusing resulting optical radiation propagating through the mask onto a second photoresist layer located on a major surface of a wafer or onto a layer of substance located on the major surface of the wafer;

(c) developing the second photoresist layer, whereby an edge feature is formed therein; and (d) forming a feature at the major surface of the wafer or in the layer of substance, respectively, in accordance with the edge feature in the second photoresist layer.

6. The method of claim 1 followed by stripping the second patterned resist layer.

7. The method of claim 6 in which step (c) is performed by the steps of:

etching substantially only the second layer using the first patterned resist layer as a first protective mask against the etching, followed by removing the first patterned resist layer, followed by etching only the first layer using the resulting patterned second layer as a second protective mask.

8. A photolithographic method including the steps of:

(a) forming the mask in accordance with the steps of claim 7;

(b) directing optical radiation of the wavelength $\lambda$ onto the mask, and focusing resulting optical radiation propagating through the mask onto a second photoresist layer located on a major surface of a wafer or onto a layer of substance located on the major surface of the wafer;

(c) developing the second photoresist layer, whereby an edge feature is formed therein; and (d) forming a feature at the major surface of the wafer or in the layer of substance, respectively, in accordance with the edge feature in the second photoresist layer.

9. A photolithographic method including the steps of:

(a) forming the mask in accordance with the steps of claim 6;

(b) directing optical radiation of the wavelength $\lambda$ onto the mask, and focusing resulting optical radiation propagating through the mask onto a second photoresist layer located on a major surface of a wafer or onto a layer of substance located on the major surface of the wafer;

(c) developing the second photoresist layer, whereby an edge feature is formed therein; and (d) forming a feature at the major surface of the wafer or in the layer of substance, respectively, in accordance with the edge feature in the second photoresist layer.

10. The method of claim 1 in which step (a) is performed by the steps of:

forming a first resist layer of substantially uniform thickness on the top surface of the second layer;

exposing the first resist to a first pattern of actinic radiation; and developing the first resist layer.

11. The method of claim 10 in which step (c) is performed by the steps of:

etching substantially only the second layer using the first patterned resist layer as a first protective mask against the etching, followed by removing the first patterned resist layer, followed by etching only the first layer using the resulting patterned second layer as a second protective mask.

12. A photolithographic method including the steps of:

(a) forming the mask in accordance with the steps of claim 11;

(b) directing optical radiation of the wavelength $\lambda$ onto the mask, and focusing resulting optical radiation propagating through the mask onto a second photoresist layer located on a major surface of a wafer or onto a layer of substance located on the major surface of the wafer;

(c) developing the second photoresist layer, whereby an edge feature is formed therein; and (d) forming a feature at the major surface of the wafer or in the layer of substance, respectively, in accordance with the edge feature in the second photoresist layer.

13. A photolithographic method including the steps of:

(a) forming the mask in accordance with the steps of claim 10;

(b) directing optical radiation of the wavelength $\lambda$ onto the mask, and focusing resulting optical radiation propagating through the mask onto a second photoresist layer located on a major surface of a wafer or onto a layer of substance located on the major surface of the wafer;

(c) developing the second photoresist layer, whereby an edge feature is formed therein; and (d) forming a feature at the major surface of the wafer or in the layer of substance, respectively, in accordance with the edge feature in the second photoresist layer.

14. The method of claim 1 in which step (c) is performed by the steps of:

etching substantially only the second layer using the first patterned resist layer as a first protective mask against the etching, followed by removing the first patterned resist layer, followed by etching only the first layer using the resulting patterned second layer as a second protective mask.

15. The method of claim 14 followed by the step of stripping the second patterned resist layer.

16. A photolithographic method including the steps of:

(a) forming the mask in accordance with the steps of claim 15;

(b) directing optical radiation of the wavelength $\lambda$ onto the mask, and focusing resulting optical radiation propagating through the mask onto a second photoresist layer located on a major surface of a wafer or onto a layer of substance located on the major surface of the wafer;

(c) developing the second photoresist layer, whereby an edge feature is formed therein; and (d) forming a feature at the major surface of the wafer or in the layer of substance, respectively, in accordance with the edge feature in the second photoresist layer.

17. A photolithographic method including the steps of:

(a) forming the mask in accordance with the steps of claim 14;

(b) directing optical radiation of the wavelength $\lambda$ onto the mask, and focusing resulting optical radiation propagating through the mask onto a second photoresist layer located on a major surface of a wafer or onto a layer of substance located on the major surface of the wafer;

(c) developing the second photoresist layer, whereby an edge feature is formed therein; and (d) forming a feature at the major surface of the wafer or in the layer of substance, respectively, in accordance with the edge feature in the second photoresist layer.

18. A photolithographic method including the steps of:

(a) forming the mask in accordance with the steps of claim 1;

(b) directing optical radiation of the wavelength $\lambda$ onto the mask, and focusing resulting optical radiation propagating through the mask onto a third photoresist layer located on a major surface of a wafer or onto a layer of substance located on the major surface of the wafer;

(c) developing the third photoresist layer, whereby an edge feature is formed therein; and (d) forming a feature at the major surface of the wafer or in the layer of substance, respectively, in accordance with the edge feature in the second photoresist layer.

\* \* \* \* \*